United States Patent [19]
Burke et al.

[11] 4,084,257
[45] Apr. 11, 1978

[54] SIGNAL PROCESSING APPARATUS

[75] Inventors: Hubert K. Burke, Scotia; Gerald J. Michon, Waterford, both of N.Y.

[73] Assignee: General Electric Company, Schenectady, N.Y.

[21] Appl. No.: 798,591

[22] Filed: May 19, 1977

[51] Int. Cl.² .............................................. G06G 7/12
[52] U.S. Cl. ........................... 364/862; 307/221 D; 357/24; 364/826; 365/45; 365/183
[58] Field of Search .......................... 235/193; 357/24; 307/304, 221 D; 250/211 J; 340/173 R, 173 CA

[56] References Cited
U.S. PATENT DOCUMENTS

| | | | |
|---|---|---|---|
| 4,011,441 | 3/1977 | Michon et al. | 235/193 |
| 4,012,758 | 3/1977 | Esser | 357/24 |
| 4,039,978 | 8/1977 | Heller | 307/221 D X |
| 4,041,298 | 8/1977 | Lampe et al. | 235/193 |

*Primary Examiner*—Joseph F. Ruggiero
*Attorney, Agent, or Firm*—Julius J. Zaskalicky; Joseph T. Cohen; Jerome C. Squillaro

[57] ABSTRACT

An analog memory apparatus for storing and retrieving a sequence of samples of an analog signal is described. The apparatus includes a plurality of storage devices each storing each of the samples of the sequence with appropriate sign in accordance with a predetermined code. The samples stored in each device represent a respective algebraic sum of the samples of the sequence. To retrieve the samples of the analog signal the different algebraic sums of samples stored in the devices are algebraically summed in accordance with the predetermined code.

11 Claims, 32 Drawing Figures

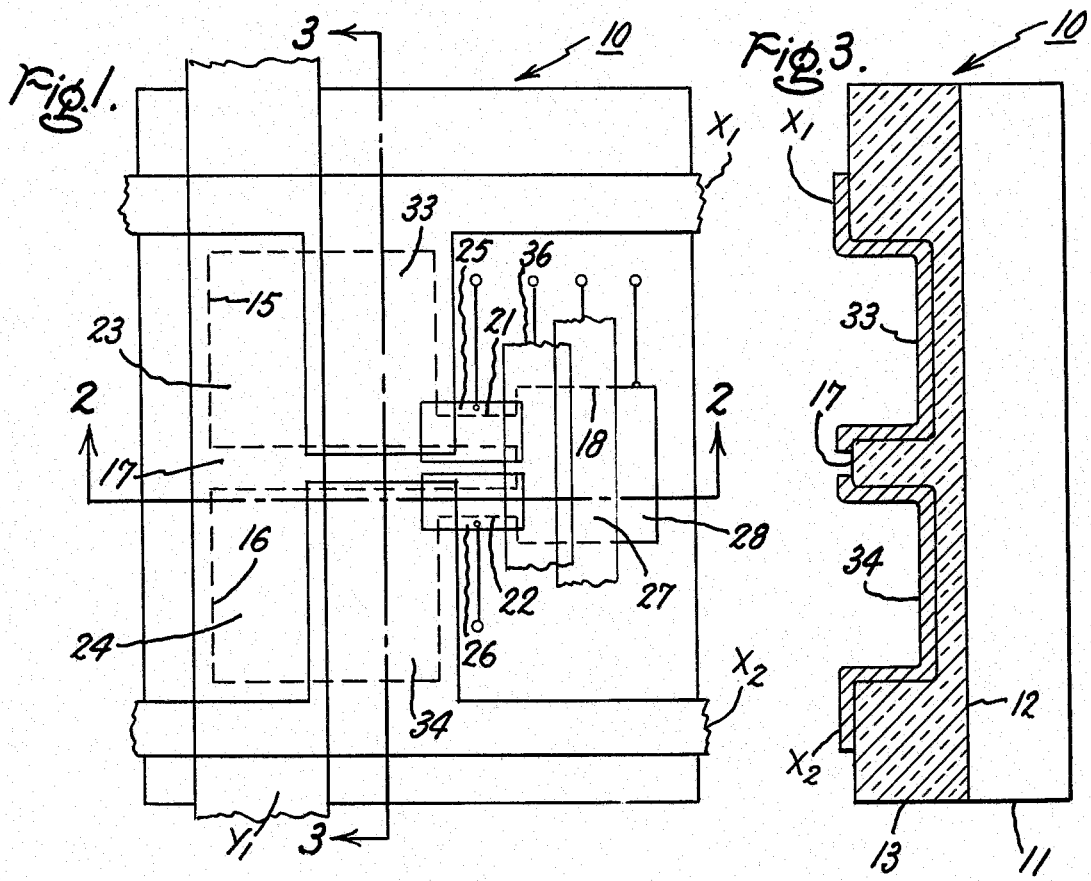

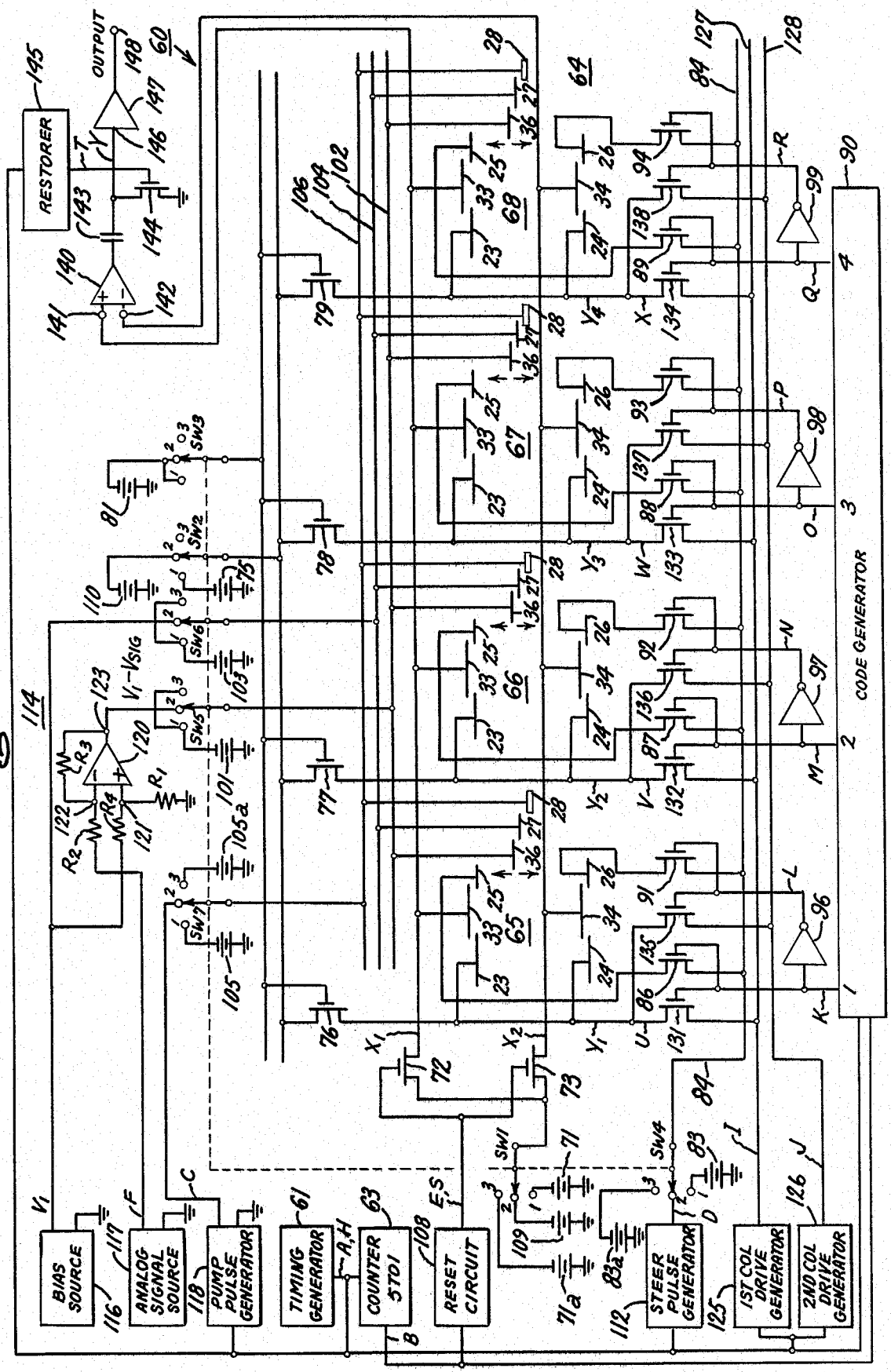

Fig. 8

TABLE-1

CODE

|   | 1 | 2 | 3 | 4 |
|---|---|---|---|---|
| A | + | + | + | + |
| B | + | + | − | − |
| C | + | − | − | + |
| D | + | − | + | − |

TABLE-2

$+S_1 + S_2 + S_3 + S_4 = \Sigma_A$ $+S_1 + S_2 - S_3 - S_4 = \Sigma_B$ $+S_1 - S_2 - S_3 + S_4 = \Sigma_C$ $+S_1 - S_2 + S_3 - S_4 = \Sigma_D$

TABLE-3

$+\Sigma_A + \Sigma_B + \Sigma_C + \Sigma_D = 4S_1$ $+\Sigma_A + \Sigma_B - \Sigma_C - \Sigma_D = 4S_2$ $+\Sigma_A - \Sigma_B - \Sigma_C + \Sigma_D = 4S_3$ $+\Sigma_A - \Sigma_B + \Sigma_C - \Sigma_D = 4S_4$

SIGNAL PROCESSING APPARATUS

This invention relates in general to signal processing apparatus comprising charge transfer devices, and in particular relates to such apparatus for storing and retrieving analog signals.

In prior art apparatus for storing and retrieving an analog signal, such as for example, the apparatus disclosed in U.S. Pat. No. 4,000,418, assigned to the assignee of the present application, an array of charge storage devices on a common semiconductor substrate are utilized. In such apparatus an input analog voltage signal is converted into charge packets which are stored in MOS capacitors in each of the storage devices. The charge packets in the devices are reconverted into electrical impulses to retrieve the analog signal. The viability of such apparatus is critically dependent upon the accuracy with which the input analog signal can be converted into packets of charge. Since this conversion is dependent upon the geometry of the devices and the MOS threshold voltages thereof among other factors, a device-to-device variation in output signal not representative of input signal is unavoidable. The device-to-device variations are collectively referred to as pattern noise.

Such prior art apparatus has a number of disadvantages including charge transfer losses, offsets in retrieved analog signal resulting from threshold voltage variations from device to device, and gain errors resulting from variations in the areas of the electrodes associated with the devices.

The present invention is directed to overcoming disadvantages and limitations such as mentioned above.

An object of the present invention is to provide improvements in analog memory apparatus utilizing MOS capacitive elements.

Another object of the present invention is to provide memory apparatus utilizing MOS elements of greatly improved dynamic range.

Another object of the present invention is to provide analog memory apparatus utilizing MOS capacitive elements which are relatively simple to make with high yield.

In carrying out the invention in one illustrative embodiment thereof there is provided a substrate of semiconductor material having a major surface and of one type conductivity. A first means for forming a plurality of first charge storage regions for opposite type carriers adjacent the major surface of the substrate is provided. A second means for forming a plurality of second charge storage regions for opposite type carriers adjacent the major surface of the substrate, each coupled to a respective first charge storage region to form a plurality of first storage cells is provided. A third means for forming a plurality of third charge storage regions for opposite type carriers adjacent the major surface of the substrate is provided. A fourth means for forming a plurality of fourth charge storage regions for opposite type carriers adjacent the major surface of the substrate, each coupled to a respective third charge storage region to form a plurality of second charge storage cells is provided. Each of the first charge storage cells is paired with a respective one of the second charge storage cells. A first row conductor line, a second row conductor line and a plurality of column conductor lines are provided. The first means includes a plurality of first electrodes, each insulatingly overlying a respective one of the first storage regions and each connected to the first row line. The second means includes a plurality of second electrodes, each insulatingly overlying a respective one of the second storage regions. The third means includes a plurality of third electrodes, each insulatingly overlying a respective one of the third storage regions and each connected to the second row line. The fourth means includes a plurality of fourth electrodes, each insulatingly overlying a respective one of the fourth storage regions. The second and fourth electrodes of each of the pairs of first and second storage cells is connected to a respective column line. A plurality of charge introduction means, each associated with a respective one of the pairs of first and second storage cells, is provided. Each of the charge introduction means develops a sequence of packets of charge in response to an analog signal, each packet of charge of the sequence being proportional to a respective sample of the analog signal. The number of packets of charge in a sequence is equal to the number of pairs of first and second storage cells. Corresponding packets of charge of the sequences of packets are identical. Each of the charge introduction means includes means for transferring a packet of charge alternatively into the cells of a respective pair of cells.

The novel features which are believed to be characteristic of the present invention are set forth with particularity in the appended claims. The invention itself, both as to its organization and method of operation, together with further objects and advantages thereof, may best be understood by reference to the following description taken in connection with the accompanying drawings in which FIG. 1 is a plan view of a charge transfer device of the apparatus of FIG. 5.

FIG. 2 is a sectional view of the device of FIG. 1 taken along section lines 2—2 thereof.

FIG. 3 is another sectional view of the device of FIG. 1 taken along section lines 3—3 thereof.

FIG. 4 is a diagram of semiconductor surface potential versus distance along the semiconductor surface of the charge transfer device of FIGS. 1, 2, and 3 useful in explaining the manner in which quantities or packets of charge are formed in the charge transfer device in accordance with the present invention.

FIG. 5 is a schematic diagram of surface charge analog memory apparatus in accordance with an embodiment of the present invention.

FIG. 7 is another diagram of semiconductor surface potential versus distance along the semiconductor surface of the charge transfer device of FIGS. 1, 2, and 3 useful in explaining the manner in which quantities or packets of charge are removed from the charge transfer device in accordance with the present invention.

Figure 6A:
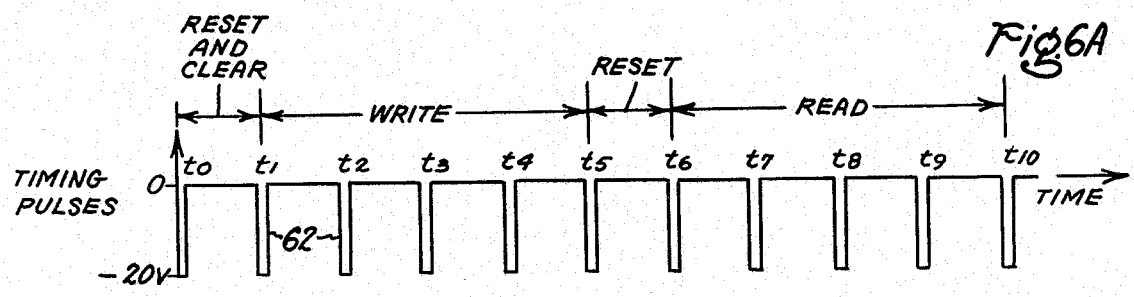
FIGS. 6A through 6Y are diagrams of amplitude versus time of voltage signals occurring at various points in the system of FIG. 5. The point of occurrence of a signal of FIGS. 6A–6Y in the block diagram of FIG. 5 is identified in FIG. 5 by a literal designation corresponding to the literal designation of FIGS. 6A–6Y.

FIG. 8 shows three tables useful in explaining the operation of the present invention. Table 1 shows a Hadamard matrix of the fourth order. Table 2 represents four equations each including the same independent variables which are algebraically summed according to the code represented by a respective row of the matrix of Table 1. Each of the independent variables represents a sample of an analog signal to be stored in the apparatus of FIG. 5. Table 3 shows four equations in which the independent variables are the four sums of Table 2. The independent variables are summed in accordance with the Hadamard matrix of Table 1 to obtain four sums each proportional to a respective one of the independent variables of Table 2.

Reference is now made to FIGS. 1, 2, and 3 which show a single charge storage and retrieval device 10 with its associated charge introduction means in accordance with one aspect of the present invention. The device 10 generates a sequence of signal samples in the form of packets of charge in response to an applied analog signal and transfers each packet of charge alternatively into a first or a second storage cell of the device in response to steering signals applied to a pair of steering gates. One steering gate couples the charge generation means to the first cell and the other steering gate couples the charge generation means to the second cell.

The device 10 comprises a substrate 11 having a major surface 12. Conveniently the substrate 11 is shown as of N-type conductivity. A layer 13 of thick insulation which may conveniently be silicon dioxide is provided overlying the major surface 12 of the substrate. A pair of generally rectangular recesses 15 and 16 are provided in the thick insulating layer, each recess extending to within a short distance of the major surface 12 of the semiconductor substrate 11 to provide a region of thin insulation lying thereover. The rectangular recesses 15 and 16 are of identical cross-sectional outline and are spaced apart by a portion of thick insulation 17. A third rectangular recess 18 essentially smaller in cross-sectional outline than the aforementioned recesses is provided in the thick insulating layer 13, similarly extending to within a short distance of the major surface 12 of the semiconductor substrate 11 to provide a region of thin insulation lying thereover. The third recess 18 opens into the first recess 15 through a narrow channel portion 21 in the thick insulation 13, and similarly the third recess 18 opens into the second recess 16 through a second narrow channel portion 22 in the thick insulation 13. Overlying substantially one half of the first and second recesses 15 and 16 and also extending over the adjacent portions of thick insulation is a conductive member conveniently designated as a column line $Y_1$. Portions of the column line $Y_1$ lying in the recesses constitute, respectively, first storage electrode 23 and third storage electrode 24. Lying over the first narrow channel portion 21 overlying portions of thick insulation adjacent thereto, and also extending partially into the first recess 15 and into the third recess 18 is a first steering gate member 25. Similarly, overlying the second narrow channel portion 22, and adjacent thick insulation portions, and also extending partially into the second recess 16 and into the third recess 18 is a second steering gate 26. Centrally situated in the third recess 18 and spaced from the side of the third recess having access to the narrow channel portions 21 and 22 is a control gate member 27. In the semiconductor substrate 11 underlying the portion of the third recess 18 included between the side opposite the side having access to the narrow channel portions 21 and 22 and the adjacent edge of the control gate member 27 is a region of P-type conductivity 28. The region of P-type conductivity provides a source of minority carrier charge for the device. A second layer 31 of thin insulation is provided in each of the recesses 15, 16, and 18 and in the narrow channel portions overlying first and third electrodes 23 and 24, first and second steering gates 25 and 26, and also overlying the control gate 27. A pair of conductive members conveniently referred to as a first row line $X_1$ and a second row line $X_2$ are provided overlying the thick insulation 13 and extending generally perpendicular to and in insulated relationship with the column line $Y_1$. Row line $X_1$ is spaced adjacent the first recess 15 and has an extension including a portion 33 which overlies the remaining portion of the first recess 15 not covered by the column line $Y_1$ and insulated therefrom. The portion 33 is referred to as the second storage electrode. Similarly, the second row line $X_2$ situated adjacent the second recess 16 and has an extension including a portion 34 which overlies the portion of the second recess not covered by the column line $Y_1$ and insulated therefrom. The portion 34 is referred to as the fourth storage electrode. Lying on the second thin insulation 31 and overlying the first and second steering gates 25 and 26 and the control gate 27 is a storage gate 36. The column line $Y_1$ and the first and third storage electrodes 23 and 24 may be constituted of a suitable material such as doped polycrystalline silicon. Similarly, the steering gate members 25 and 26 and also the control gate member 27 may be constituted of polycrystalline silicon. The row lines $X_1$ and $X_2$ and also the second storage electrode 23 and the fourth storage electrode 24 may be constituted of a conductive material such as aluminum. Conveniently, the storage gate 36 may also be constituted of aluminum.

The operation of the device of FIGS. 1, 2, and 3 will now be described in connection with the diagram of FIG. 4. A negative voltage of nominally −10 volts is applied to the column line with respect to the substrate to produce or form a first storage region underlying the first electrode 23 and a storage region underlying the third electrode 24. The applied negative voltage lowers the surface potential of the first and third storage regions to a first value 41, shown as about −8 volts (assuming a threshold voltage of about 2 volts). The application of another negative potential of −20 volts to the row lines $X_1$ and $X_2$ will form a second storage region underlying second electrode 33 and a fourth storage region underlying fourth electrode 34. This negative voltage lowers the semiconductor surface potentials underlying these electrodes to a second value 42 shown as about −18 volts. The steering gate electrodes 25 and 26 are connected to a source of negative voltage of about −5 volts to provide a surface potential 43 underlying these electrodes of about −3 volts (just beyond threshold). Assume that a negative voltage such as $V_1$ is applied to the control gate 27 to produce a surface potential 44 substantially smaller in absolute magnitude than the surface potential 42 underlying the second and fourth storage electrodes. Also, assume that the negative voltage $V_1$ minus an analog signal is applied to the storage gate electrode 36, and that the analog signal is negative so as to drive the storage gate 36 more negative than voltage on the control gate 27 and produce a surface potential in the substrate underlying storage gate 36 having a value 45 which is greater in absolute magnitude than the value 44. Further, assume that the value of surface potential 45 is substantially smaller in magnitude than the value of surface potential 42 underlying the second and fourth storage electrodes 33 and 34. If the charge source 28 is now pumped or pulsed so as to raise its potential above the surface potential 44 underlying the control gate 27, minority carrier charge is caused to flow from the source region 28 through the surface adjacent region underlying the control gate 27 into a region underlying the storage gate 36. With a pulse of long enough duration, the region underlying storage gate 36 is filled with charge and any excess charge is caused to spill back to the source region 28 after its potential has dropped below the potential of the surface adjacent region underlying control gate 27. Thus, a packet of charge Q is formed in the region underlying storage gate 36 which is proportional to the cross-sectional area of this region and the difference in potential of surface potential 44 and surface potential 45. As the voltage $V_1$ is a constant and as the cross-sectional area of the storage region is constant, the resultant sample or packet of charge generated is proportional to a sample of the applied analog signal. The particular sample of the analog signal obtained is the amplitude occuring at the trailing edge of the pump pulse when the region 28 is lowered in potential below the potential of the surface adjacent region underlying electrode 27. If now a suitable voltage is applied to second steering gate 26 for example, to lower the surface potential thereunder to a value 46 greater in absolute magnitude than the value 45, the packet of charge Q is caused to flow into the fourth storage region underlying the fourth electrode 34. Conversely, if the steering gate 26 is maintained at just above the threshold voltage, for example −5 volts, and the potential of the first steering gate electrode 25 is lowered to the value 46 greater in absolute magnitude than the value 45, the packet of charge is caused to flow into the second storage region underlying the second electrode 33. Thus, the device 10 is capable of developing a sequence of packets of charge in response to an analog signal, each packet of charge of the sequence being proportional to a respective sample of a time varying analog signal. The device is further capable of storing or transferring each of the packets of the sequence into either a first charge storage cell comprising the first and second storage regions underlying electrodes 23 and 33, respectively, or into a second charge storage cell comprising storage third and fourth storage regions underlying electrodes 24 and 34 respectively, dependent on the steering signal applied to the steering gates 25 and 26. Thus, if it is desired to store packets of charge of a sequence in accordance with a particular algebraic sum, the packets to be stored with one sign are transferred to the first storage cell of the device, and packets to be stored with the opposite sign are transferred to the second storage cell of the device. Of course, the first and second charge storage cells are made large enough to hold all of the packets of the sequence.

Reference is made to FIG. 5 which shows signal processing apparatus 60 including an assembly 64 of a plurality of charged transfer devices 65, 66, 67 and 68, each identical to device 10 of FIGS. 1, 2 and 3 and formed on a common substrate. The apparatus develops a plurality of identical sequences of packets of charge in response to an analog signal with each packet of the charge of a sequence being proportional to a respective sample of a time varying analog signal. Each of the sequences of packets is stored in a respective device of the apparatus in accordance with a respective algebraic sum. The packets of a sequence to be summed with one sign are stored in the first cell of a device and the packets of charge to be summed with the opposite sign are stored in the second cell of the device. Means are provided for recovering the initial samples of the analog signal by deriving signals proportional to the algebraic sums of the packets stored in the devices.

Only four devices are shown in the apparatus for reasons of simplicity in describing the apparatus and explaining the operation thereof. Elements of devices 65, 66, 67 and 68 identical to elements of device 10 are identically designated. The first electrode 23 and the third electrode 24 of device 65 are connected to line $Y_1$, the first electrode 23 and the third electrode 24 of device 66 are connected to column line $Y_2$, the first electrode 23 and the third electrode 24 of device 67 are connected to column line $Y_3$, and the first electrode 23 and the third electrode 24 of device 68 are connected to column line $Y_4$. The second electrodes 33 of devices 65-68 are connected to first row line $X_1$. The fourth electrodes 34 of devices 65-68 are connected to second row line $X_2$.

Figure 6B:
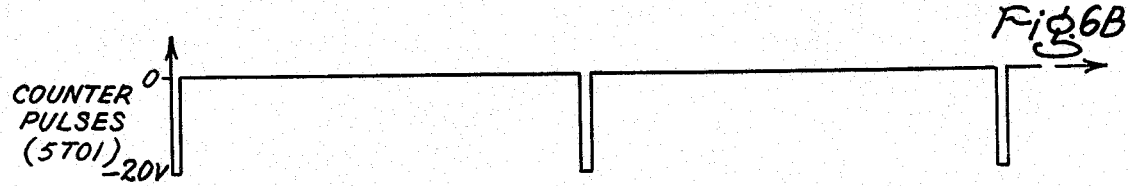
Figure 6C:
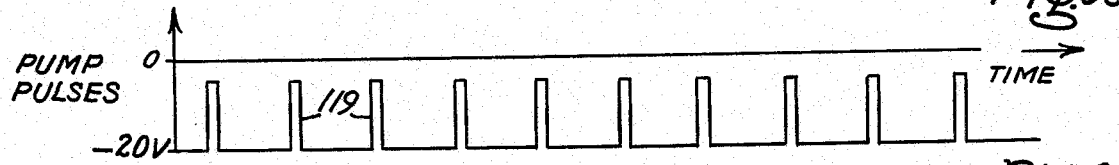
Figure 6D:
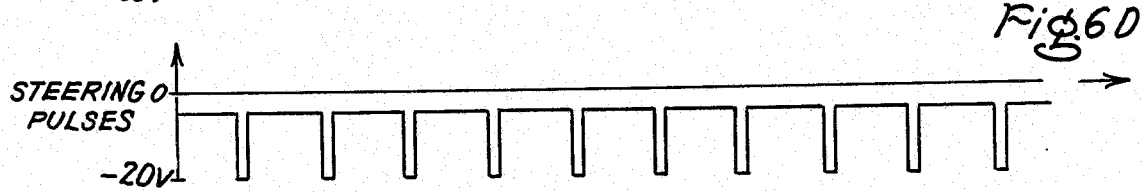
Figure 6E:
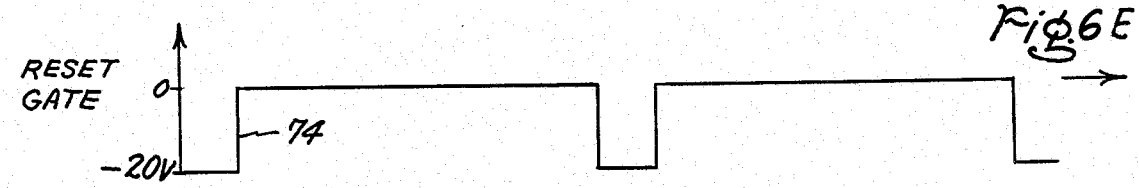
Figure 6F:
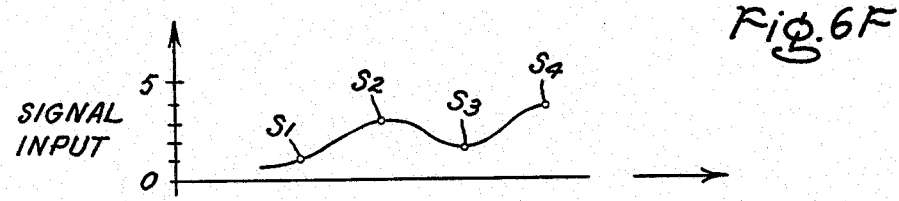
Figure 6G:
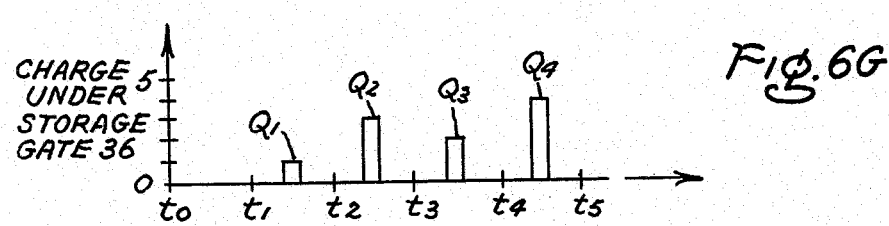
Figure 6H:
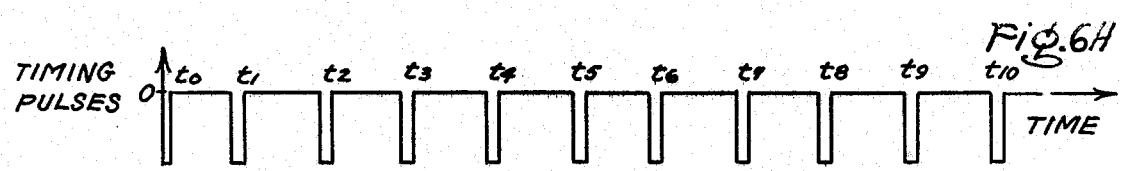
Figure 6I:

The apparatus 10 will be described in connection with FIGS. 6A through 6Y which show diagrams of amplitude versus time of signals occurring at various points in the apparatus of FIG. 5. The point of occurrence of a signal of FIGS. 6A-6Y is referenced in FIG. 5 by a literal designation corresponding to the literal designation of the figure reference. The apparatus includes timing generator 61 which develops a series of regularly occurring pulses 62 of short duration, shown in FIG. 6A occurring in sequence at instants of time $t_0-t_{10}$ with the interval $t_0-t_5$ representing a write or storage cycle and the interval from $t_5-t_{10}$ representing a read or retrieval cycle of the array of devices. The interval $t_0-t_1$ of the write cycle represents the reset interval during which the electrodes of the devices of the apparatus are cleared of charge to enable successive write operations to be performed. The generation and introduction of charge into each of the devices occurs during successive intervals $t_1-t_2$, $t_2-t_3$, $t_3-t_4$, and $t_4-t_5$. Reset prior to a read-out of charge stored in the devices occurs during the interval $t_5-t_6$. Successive read operations are performed during successive read intervals $t_6-t_7$, $t_7-t_8$, $t_8-t_9$, and $t_9-t_{10}$. The output of the timing generator 61 is connected to a counter 63 which divides the count of the timing generator 61 by five to provide an output such as shown in FIG. 6B. The timing generator 61 and the counter 63 provide the basic timing for the apparatus of FIG. 5. A plurality of three-position mode switches SW1-SW7 are provided. Each of the switches includes stationary contacts 1, 2 and 3 representing, respectively, the clear, write and read positions of the switches, and a movable contact or arm.

The manner in which the apparatus 10 is cleared of previously written-in charge as well as extraneous charge preparatory to writing new charge into the devices will now be described. The mode switches SW1-SW7 are set so that the movable contacts thereof engage the number 1 contacts thereof. Switch SW1 connects a source 71 of negative potential through transistor switches 72 and 73 to respective first and second row lines $X_1$ and $X_2$. The transistor switches 72 and 73 are closed only when a reset pulse of the form shown in FIG. 6E is applied to the gates of the transistor switches 72 and 73 from reset circuit 108. Switch SW2 connects a source of negative potential 75 through each of transistor switches 76-79 to respective column lines $Y_1-Y_4$. Switch SW3 connects a source of negative potential 81 to the gate electrodes of transistors 76-79 to maintain these switches in an ON position and thus the negative potential of source 75 is applied to the first and third electrodes 23 and 24 of all of the devices 65-68 of the assembly 64. Switch SW4 connects a source of negative potential 83 to steer bus 84. Each of the steering gates 25 of devices 65–68 is connected through a respective one of transistor switches 86–89 to steer bus 84. The operative condition of the switches 86–89 is dependent on the voltage waveforms applied to the gate electrodes thereof from respective terminals 1–4 of code generator 90. Each of the second steering gates 26 of devices 65–68 is connected through a respective one of transistor switches 91–94 to the steer bus 84. The operative condition of the switches 91–94 is dependent on the voltage applied to the gate electrodes thereof. Terminals 1–4 of the code generator 90 are connected through respective inverters 96–99 to the gates of respective transistor switches 91–94. The voltage wave forms of FIGS. 6K, 6M, 6O and 6Q control the first steering gates 25 of the devices 65–68 and the voltage wave forms of FIGS. 6L, 6N, 6P and 6R control the second steering gates 36 of the devices 65–68. When the gates of transistors 86–89 are ON, the voltage of source 83 is applied to the first steering of the devices and when the gates of transistors 91–94 are ON, the voltage of source 83 is applied to the second steering gates of the devices. The code generator generator 90 develops waveforms of FIGS. 6K, 6M, 6O, and 6P from inputs applied thereto from timing generator 61 and counter 63. Switch SW5 connects a source 101 of negative voltage to storage gate bus 102 and to each of the storage gates 36 of the devices. Switch SW6 connects a source 103 of negative voltage to control gate bus 104 and to each of the control gates 27 of the devices. Switch SW7 connects a source 105 of negative voltage to the source bus 106 to which each of the source regions 28 of the devices are connected.

Reference is now made to FIG. 7 which shows the surface potentials underlying the electrodes of each of the devices 65–68 when the switches SW1–SW7 are in position one or the clear position and the sources of d-c potential connected to the number 1 contacts of these switches are in circuit. It is apparent from FIG. 7 the potential of the various sources is set so that the surface potentials of the surface regions underlying the electrodes of the devices starting from the first storage electrode 24 and ending with the source region 28 are progressively more negative. This result may be obtained by using values for the sources 75, 71, 83, 101, 103 and 105 (FIG. 5) which are nominally $-5$, $-8$, $-9$, $-10$, $-11$, and $-10$ volts, respectively, thus providing a step by step drop in potential from a surface potential of $-3$ underlying the first and third column electrodes 23 and 24 to a potential of $-10$ in the source region 28. (A threshold voltage of about $-2$ volts is assumed). Thus, charge residing in the devices from a previous write cycle can flow out of the devices preparatory to the next write cycle. In view of the fact that voltage is maintained on all of the electrodes between successive write cycles, the loss of charge to the surface states during charge transfer is avoided with resultant improved accuracy of the device. If the devices were emptied of charge by simply injecting the charge into the substrate, on initiation of the next write cycle some of the charge of the packets would be lost to the surface states during the transfer of charge from the charge introduction means into the storage cells of the devices. During the clear mode described, a voltage is maintained on all of the electrodes of the devices which is above the threshold voltage of the electrodes. The potentials applied to the electrodes of the devices during the clear operation are all fixed potentials except for the potential applied to the row lines $X_1$ and $X_2$ through transistor switches 72 and 73 which are gated by the output from the reset circuit 108, and except for the potentials applied to the first and second steering gates 25 and 26 through transistor switches 86–89 and 91–94 which are gated by the code generator 90. During the interval $t_0-t_1$, the reset pulse 74 of FIG. 6F occurs and actuates transistor switches 72 and 73 to connect the row lines $X_1$ and $X_2$ to the source 71 during this interval. Also, during this same interval the waveforms of FIGS. 6K, 6M, 6O, and 6Q provide gating voltages to transistors 86 through 89 respectively, operatively connecting the first steering gates 25 of the devices 65 through 68 to the steering bus 84. Thus, the profile of surface potential shown in FIG. 7 is established in the substrate by the above voltages applied to the electrodes 23, 33, 25, 26, 27, and 28. During a second portion of the reset cycle, the voltages of the waveforms of FIGS. 6K, 6M, 6O, and 6Q rise to zero, while the voltage of the waveforms of FIGS. 6L, 6N, 6P, and 6R drop to a negative value and actuate switches 91 through 94 which connect the second steering gate 26 of devices 65 through 68 to the steering bus 84. Thus, the step profile of surface potential shown in FIG. 7 is also established in the substrate by the above voltages applied to 24, 34, 26, 36, 27, and 28. Thus, at the conclusion of the reset cycle, $t_0-t_1$, the devices are cleared of charge and are ready to receive new charge in the following write cycle.

The manner in which charge is written into the apparatus will now be explained. Just prior to the end of the reset interval $t_0-t_1$ the mode switches $SW_1$ through $SW_7$ are set to position 2 to prepare the apparatus to generate or develop charge in response to an analog signal and to store such charge in the devices thereof. Switch $SW_1$ connects a source 109 of negative potential nominally $-20$ volts to the transistor devices 72 and 73 which are in turn connected to the row lines $X_1$ and $X_2$. The transistors 72 and 73 are turned ON during the reset interval $t_0-t_1$, and the row lines $X_1$ and $X_2$ are charged to the potential of the source 109. Switch $SW_2$ connects the source of negative potential 110 nominally $-10$ volts to the column line switches 76 through 79 which in turn are turned on by switch $SW_3$ applying a large negative voltage from source 81 to the gates of these transistor switches. Switch $SW_4$ connects the output of the steering pulse generator 112 to the steering bus. The steering pulse generator 112 is synchronized by the timing generator 61 and provides output pulses such as shown in FIG. 6D. Switch $SW_5$ connects the output of the analog signal inverting amplifier 114 to the storage gates 36 of each of the devices 65 through 68. Switch $SW_6$ connects the potential $V_1$ of the biased source 116 to the control gate bus 104 to which in turn the control gates 27 of the devices 65 through 68 are connected. The negative voltage $V_1$ is set to lie substantially closer to ground than to $-20$ volts, the potential on second and fourth electrodes 33 and 34. Additionally, the voltage $V_1$ minus the voltage of the analog signal is also set to be less than the voltage applied to the second and fourth storage electrodes 33 and 34 of the devices for reasons which will be explained below. The repetition rate of the pulses 119 from the output of the pump pulse generator 118 is the same as the repetition rate of the pulses 62 of the timing generator 61. Each pulse 119 of the output of the pump pulse generator 118 is shown delayed from the time of occurrence of the corresponding pulse from the timing generator 61. The voltages applied from the amplifier 114, from the bias source 116, and from the pump pulse generator 118 to electrodes 36, 27 and 28, respectively, of devices 65 through 68 function to develop in the charge introduction portions of these devices sequences of packets of charge. The sequences are identical and corresponding packets of the sequences are substantially identical. During the time interval $t_1$ through $t_2$, a packet of charge $Q_1$ is developed in each of the charge introduction means. Each of the packets $Q_1$ is proportional to a sampling level $S_1$ of the analog signal. In the time interval or period $t_2$–$t_3$, the second packet $Q_2$ is developed in each of the sequences. Each of the packets $Q_2$ is proportional to a second level $S_2$ of the analog signal, and so on. See FIGS. 6F and 6G. Prior to the development of the second samples or packets $Q_2$ of the sequences, the first packets are steered into either the first cells comprising electrodes 23 and 33 or into the second cells comprising electrodes 24 and 34 of the devices. The steering of the packets in the sequence is accomplished by action of voltages applied to the gates of transistors 86 through 89 and transistors 92 through 94. The voltages utilized for controlling these transistors are developed by the code generator 90 and are provided at terminals 1, 2, 3, and 4 thereof, respectively, to devices 65 through 68. One input line of the code generator 90 is connected to the timing generator 61 and another input line thereof is connected to the counter 63. As mentioned above, the code generator 90 develops at terminals 1, 2, 3, and 4 the voltage waveform shown in FIGS. 6K, 6M, 6O and 6Q, respectively. The inverters 96 through 99 invert the latter voltage waveforms to provide voltage waveforms shown in FIGS. 6L, 6N, 6P and 6R, respectively. The repetition rate of the steering pulses of FIG. 6D is the same as the repetition rate of the pump pulses of FIG. 6C. However, each of the steering pulses is delayed by a predetermined interval from the time of occurrence of a corresponding pump pulse to allow the corresponding packet of charge in each of the devices 65 through 68 to be generated before it is steered into either the first cell or second cell of the devices 65 through 68.

The voltage $V_1$ minus the analog signal applied to the storage gate 36 is obtained from inverting amplifier 114. The inverting amplifier 114 includes a differential amplifier 120 having a noninverting terminal 121 and inverting terminal 122 and an output terminal 123. Resistor $R_1$ is connected between terminal 121 and ground. Resistor $R_2$ is connected between terminal 122 and the analog signal source 117. Resistor $R_3$ is connected between the inverting terminal 122 and the output terminal 123. A coupling or voltage dividing resistor $R_4$ is connected between the noninverting terminal 121 and the source 116 of fixed voltage $V_1$. With resistors $R_1$ thru $R_4$ equal, both the d-c component of voltage $V_1$ applied to the noninverting terminal 121 and the analog signal voltage applied to the inverting terminal 122 are amplified with unity gain. However, the analog signal is inverted resulting in a net voltage output represented by $V_1$ minus the analog signal. The analog signal obtained at the output of the analog signal source 117 is shown in FIG. 6F. In this figure are also shown the signal samples S1, S2, S3, and S4 taken during the intervals $t_1$–$t_2$, $t_2$–$t_3$, $t_3$–$t_4$, and $t_4$–$t_5$. The signal samples $S_1$ through $S_4$ produce quantities of charge $Q_1$–$Q_4$, respectively, in each of the devices 65 through 68 as shown in FIG. 6G.

Reference is now made to FIG. 8 and in particular to Tables 1 and 2 thereof. Table 1 shows a Hadamard matrix of the fourth order having four rows designated A, B, C and D having four columns designated 1, 2, 3, and 4. Table 2 shows four equations in which the independent variables are the signal samples or levels $S_1$ through $S_4$ corresponding to the charge packets $Q_1$ through $Q_4$ respectively generated in each of the identical sequences mentioned above. Each of the sums $\Sigma_A$ through $\Sigma_D$ in these equations represent, respectively, algebraic sums of the signal samples $S_1$ through $S_4$ and hence of the charge packets $Q_1$ through $Q_4$ summed in accordance with the signs set forth in respective rows A through D of Table 1. The charge packets $Q_1$ through $Q_4$ to be summed with a positive sign are transferred to the first cells of the devices 65 through 68 and the charge packets $Q_1$ through $Q_4$ to be summed with a negative sign are transferred to the second cells of the devices 65 through 68. Such a transfer is obtained by alternatively applying steering pulses to the first and second steering gates 25 and 26. The application of steering gate pulses of FIG. 6D to the first steering gates 25 is under the control of the waveforms of FIGS. 6K, 6M, 6O, and 6Q. The application of steering gate pulses of FIG. 6D to the second steering gates 26 is under the control of the waveforms of FIGS. 6L, 6N, 6P, and 6Q.

Now consider the transfer of charges which take place in each of the devices 65 through 68 over the intervals $t_1$–$t_2$, $t_2$–$t_3$, $t_3$–$t_4$, and $t_4$–$t_5$, referred to, respectively, as first, second, and third and fourth intervals of the write cycle. During the first interval $t_1$–$t_2$, the waveforms of FIGS. 6K and 6M, 6O, and 6Q are negative and hence the first steering gates 25 of the devices 65 through 68 are activated. Thus, the first packets of charge $Q_1$ representing a signal $S_1$ are transferred to the first storage cells of the devices. During the second interval of time, $t_2$–$t_3$, the waveforms of FIGS. 6K and 6M are negative and the waveforms of FIGS. 6P and 6R are also negative. Thus, the second packets of charge $Q_2$ of devices 65 and 66 are transferred to the first storage cells of these devices and the second charge packets $Q_2$ in devices 67 and 68 are transferred to the second storage cells of devices 67 and 68. During the third interval of time, $t_3$–$t_4$, the waveforms of FIGS. 6K and 6Q are negative. Hence, the third charge packets $Q_3$ in the first and fourth devices 65 and 68, respectively, are transferred to the first charge storage cells of these devices. During the third interval of time the waveforms of FIGS. 6N and 6P are negative. Hence, the third packets of charge $Q_3$ in the second and third devices 66 and 67 are transferred to the second storage cells of these devices. During the fourth interval, $t_4$–$t_5$, the waveforms of FIGS. 6K and 6O are negative. Hence, the fourth packets of charge $Q_4$ are transferred to the first charge storage cells of devices 65 and 67. During the fourth interval of time the waveforms of FIGS. 6N and 6R are negative the fourth charge packets $Q_4$ in devices 66 and 68 are transferred to the second charge storage cells of these devices. Thus, in each of the devices 65 through 68, are stored all of the charges of the sequence of charges representing signal samples $S_1$ through $S_4$. The charges are distributed between the first and second charge storage cells of the devices. In device 65 all of the packets of the sequence is stored in the first charge storage cell thereof. This is represented by the sum $\Sigma_A$ in Table 2. Conveniently, in these equations the signal sample designation $S_1$ through $S_4$ are substituted for the charge designation $Q_1$–$Q_4$ respectively, as they are equivalent. In device 66 the first and second samples, $S_1$ and $S_2$, are stored in the first charge storage cell, and the third and fourth samples, $S_3$ and $S_4$, are stored in the second charge storage cell. The storage of the samples is represented by $\Sigma_B$, the second equation in Table 2. In device 67 the first and fourth samples, $S_1$ and $S_4$, are stored in the first charge storage cell of the device, and the second and third samples, $S_3$ and $S_4$, are stored in the second charge storage cell. The sum of charges or signals stored in the device 67 is represented by $\Sigma_C$ as shown in equation 3 of Table 2. Finally, in device 68, the first and third samples $S_1$ and $S_3$ are stored in the first charge storage cell and the second and fourth samples are stored in the second charge storage cell. Thus, the charge or signal stored in the device 68 is represented by $\Sigma_D$. If it is assumed that the signals $S_1$ through $S_4$ have the values 1, 3, 2, and 4 respectively, then values of the sums $\Sigma_A$ through $\Sigma_D$ are 10, $-2$, 0, and $-4$, respectively.

In order to read out the charges stored in the devices 65 through 68, it is necessary to switch the mode switches $SW_1$ through $SW_7$ to the third position or readout position. In this position switch $SW_1$ connects the nominal $-6$ volt source 71a to the row lines $X_1$ and $X_2$, and during the reset interval $t_5-t_6$ when the gates of the transistors 72 and 73 are actuated, the lines $X_1$ and $X_2$ are charged nominally to $-6$ volts and floated. The switches $SW_2$ and $SW_3$ disconnect the voltage sources 110 and 81 from the column lines $Y_1$ through $Y_4$, and the column lines now are under the control of the waveforms developed by the code generator 90, the first column drive generator 125 and the second column generator 126. Switch $SW_4$ disconnects the steering pulse generator 112 from the steering bus 84 and connects the steering bus 84 to the source 83a which provides a negative potential of about $-5$ volts to the steering gates 25 and 26. Thus, the charge generation and introduction circuits of the devices 65 through 68 are disconnected from the first and second cells of each of the devices during the readout operation. Voltage is maintained on the storage gates 36 and control gates 27 as contacts 1 and 3 of switches $SW_5$ and $SW_6$ are connected together. It is desirable to maintain voltage on these gates to keep the semiconductor surface states filled. Switch $SW_7$ connects the source regions 28 to voltage source 105a which provides a negative voltage to the source regions to maintain these regions reversely biased with respect to the surface potentials underlying the control gates 27.

The first column drive generator 125 and the second column drive generator 126 along with the outputs from the code generator 90 are utilized for developing the waveforms of FIGS. 6U, 6V, 6W, and 6X for controlling the readout of the charge stored in the first and second cells of the devices 65 through 68. The manner in which this is accomplished will not be described. The first and second column drive generators 125 and 126 are connected to the timing generator 61. The output of the first column drive generator 125 is shown in FIG. 6I and is applied to bus 127. The output of the second column generator 126 is shown in FIG. 6J and is applied to bus 128.

Figure 6J:
Figure 6K:
Figure 6L:
Figure 6M:
Figure 6N:
Figure 6O:
Figure 6P:
Figure 6Q:
Figure 6R:
Figure 6S:
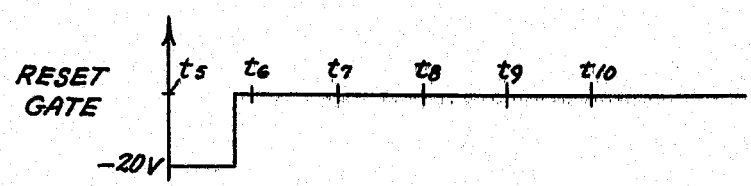
Figure 6T:

The column line drive voltages of FIGS. 6U through 6X are synthesized from the waveforms of FIGS. 6I and 6J of the first column drive generator 125 and the second column drive generator 126 under the control of the waveforms of FIGS. 6K, 6M, 6O, and 6Q, from the code generator 90 applied to transistor switches 131–138. Each of the transistors 131–134 has a drain electrode connected to the column lines $Y_1$ through $Y_4$, respectively. Also, each of the transistors 135–138 has a drain electrode connected to a respective one of the column lines $Y_1$ through $Y_4$. The sources of the transistors 131–134 are connected to the first column drive generator 125, and the sources of the transistors 135–138 are connected to the second column drive generator 126. The first column drive generator 125 provides a 10 volt pulse 139 from a base reference of $-10$ volts within the intervals $t_6-t_7$, $t_7-t_8$, and $t_8 \propto t_9$, and $t_9-t_{10}$. The second column drive generator 126 provides an output which is the complement of the output of the first column drive generator. Each of the gates of the transistors 131–134 is connected, to terminals 1 through 4, respectively, of the code generator 90. Each one of the gates of transistors 135–138 is connected through a respective one of the inverters 96–99 to a respective one of the terminals 1–4.

Figure 6U:
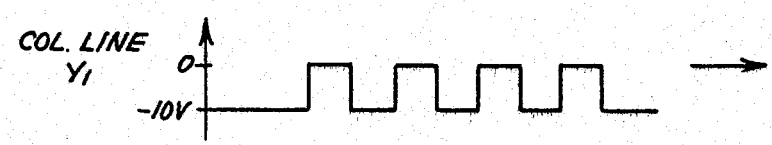
Figure 6V:
Figure 6W:
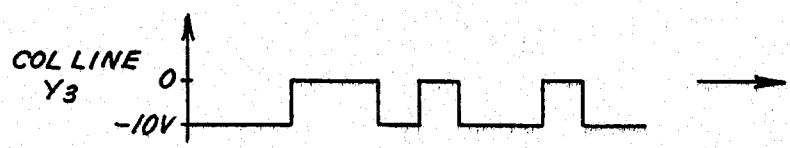
Figure 6X:
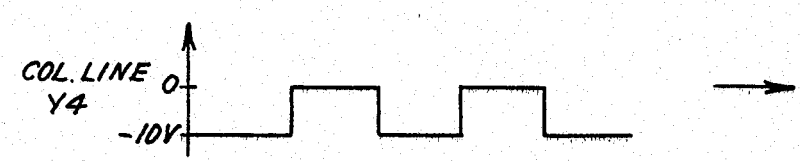
Figure 6Y:
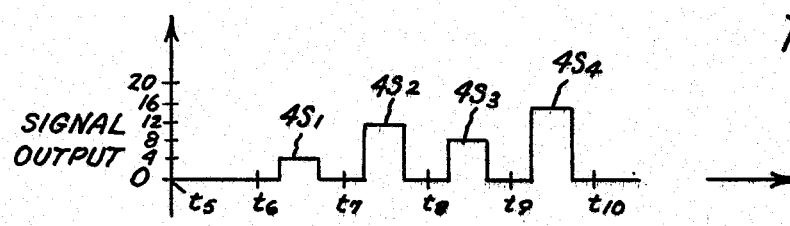

With transistor switch 131 turned ON by the voltage waveform of FIG. 6K from a time just prior to $t_6$ to a time just subsequent to $t_{10}$, the output of the first column drive generator (FIG. 6I) is applied directly to column line $Y_1$ to produce the waveform shown in FIG. 6U. With respect to the second column line $Y_2$, as the transistor switch 132 is ON from a time just prior to the time $t_6$ to a time just prior to the time $t_8$ and as the transistor switch 136 is ON from a time just prior to $t_8$ to the remainder of the period of the cycle, the waveform of voltage appearing on column line $Y_2$ is a composite of the waveforms from the first column drive generator 125 and the second column drive generator 126. Thus, over the period of time from a time just prior to $t_6$ to a time just prior to $t_8$, the first column drive generator output appears on the column line $Y_2$ and from the time just prior to $t_8$ for the remainder of the cycle the waveform of the second column drive generator appears thereon. The resultant waveform appearing on column line $Y_2$ is shown in FIG. 6V. Similarly, the switching of the waveforms of the first and second column drive generators onto the third column line $Y_3$ in response to the gating waveforms of FIGS. 6O and 6P produces the composite output shown in the waveform of FIG. 6W. Finally, the voltage appearing on the fourth column line $Y_4$ shown in FIG. 6X is produced by combining the outputs of the first and second column generators in response to the gating waveforms of FIGS. 6W and 6R.

To obtain a signal which represents the difference in charge or signal stored in the first and second cells of each of the devices, a differential amplifier 140 is provided. The non-inverting input terminal 141 of the differential amplifier is connected to the first row line $X_1$ and the inverting input terminal 142 of the differential amplifier is connected to the second row line $X_2$. The output of the differential amplifier 140 is connected through a capacitor 143, and the source to drain conduction path of transistor 144 to ground. The gate of the transistor 144 is connected to the output of restorer circuit 145 which is synchronized with the pulses from the timing generator 61 to provide restorer pulses, as shown in FIG. 6T, which are utilized to reference the output of the differential amplifier 140 at the beginning of each algebraic summation of signals corresponding to the charge packets stored in the devices of the apparatus. The output of the differential amplifier 140 is coupled through capacitor 143 to the input terminal 146 of amplifier 147, the output from which is obtained at terminal 148.

As pointed out in connection with the device of FIGS. 1, 2 and 3, the transfer of charge from a first storage region to a second storage region of a first storage cell induces a signal of one polarity on the first row line $X_1$. Conveniently, this polarity may be designated positive. If the charge is initially stored in the second storage region and transferred to the first storage region, a signal of the opposite sign is induced on the first row line $X_1$. Similarly, for the second storage cell of a device, the transfer of charge from a third storage region to a fourth storage region induces a signal on the second row line $X_2$ positive in polarity. However, as the differential amplifier 140 derives a signal which is the difference in the signals on the first and second row lines $X_1$ and $X_2$, the signal on row line $X_2$ is subtracted from the signal on row line $X_1$. Thus, a net signal is obtained which represents the algebraic sum of the charges stored in the first and second cells of the device. When charge is transferred from the second storage region of the first storage cell of a device, a negative signal is induced on the first row line $X_1$. Similarly, when charge is transferred from the fourth storage region to the third storage region of the second storage cell of the device, a negative signal is induced on the second row line $X_2$. As the first storage electrode and the third storage electrode of each device is connected to a common column line, the transfers of charge referred to in the first and second storage cells take place in unison, that is, charge is either stored in the first and third storage regions and transferred to the second and fourth regions or vice versa. Thus, a difference in charge in the first and second storage cells is always obtained. However, the polarity of this difference depends upon the direction of transfer, that is, whether charge is being transferred from the first and third storage regions to the second and fourth storage regions or vice versa. Thus, by the appropriate control of the transfer of charge, not only can signals be derived which represent algebraic sums of a sequence of charges stored in each device, but also algebraic sums of those sums can be derived.

Reference is now made to FIG. 8 and in particular to Table 3 thereof. Table 3 shows four equations in which the independent variables are the sums $\Sigma_A$ through $\Sigma_D$ corresponding to the net charge stored in each of the devices 65 through 68, respectively, and also corresponding to the net sum of signal samples $S_1$ through $S_4$ represented by these charges. Each of the sums $\Sigma_A$ through $\Sigma_D$ represent, respectively, the algebraic sums of the signals $S_1$–$S_4$ summed in accordance with the signs set forth in the respective rows A through D of Table 1. The signals $S_1$ through $S_4$ are recovered by summing the summation signals $\Sigma_A$ through $\Sigma_D$ in accordance with the signs set forth in columns 1 through 4, respectively, of Table 1. This is accomplished in the following manner. It will be recalled that in the reset interval prior to the read cycle, namely, $t_5$–$t_6$, the row lines $X_1$ and $X_2$ were charged to a potential of nominally 6 volts and floated, and as the potential appearing on the column lines $Y_1$ through $Y_4$ during this period of time was $-10$ volts, all of the charge stored in the first and second cells of each of the devices is transferred to the storage regions underlying the first and third electrodes of these devices. Prior to the application of the pulses of FIGS. 6U through 6X to the column lines, the output of the differential amplifier is restored to ground level by the restorer pulse occurring at the time $t_6$ (FIG. 6T). During the interval $t_6$–$t_7$, the voltage on the column lines $Y_1$–$Y_4$ changes from $-10$ to 0 volts, thereby causing charge to transfer from the first and third storage regions of each of the devices to the second and fourth regions of each of the devices. This transfer of charge induces signals on the first row line $X_1$ and the second row line $X_2$, the difference of which is obtained from the differential amplifier 140. This difference represents the algebraic sum of the charges algebraically stored in the devices 65 through 68 and is equal to $4S_1$, as shown in the first equation of Table 3 and also in FIG. 6Y. If it is assumed that the signals $S_1$ through $S_4$ have values of 1, 3, 2, 4, respectively, and that the summations of Table 2 provided $\Sigma_A$ through $\Sigma_D$ equal to 10, $-2$, 0 and $-4$ respectively, the summation for $4S_1$ yields a value of 4. Thus, the signal obtained at the output of the amplifier 147 is proportional to the signal sample $S_1$ multiplied by a factor 4, indicating a gain of 4. Also, during the interval, $t_6$–$t_7$, voltage on the column lines $Y_1$ and $Y_2$ drops to $-10$ volts, while the voltages on the column lines $Y_3$ and $Y_4$ remain at 0 volts. Thus, net charge to be summed with a positive sign is now stored in the first and third storage regions of devices 65 and 66 and net charge to be summed with a negative sign is stored in the second and fourth storage regions of devices 67 and 68.

At the instant $t_7$ on occurrence of the second restorer pulse, the terminal 146 is set to ground level preparatory to deriving the second summation signal $4S_2$ of Table 3. During the interval from $t_7$ to $t_8$, the voltage on the column lines $Y_1$ and $Y_2$ is increased to 0 volts and the voltage on column lines $Y_3$ and $Y_4$ is decreased to $-10$ volts. Thus, charge transfers from the first and third storage regions of devices 65 and 66 into the corresponding second and fourth storage regions of these devices, and charge also transfers from the second and fourth storage regions of devices 67 and 68 to the first and third storage regions of these devices. Thus, an output is obtained at the amplifier 147 corresponding to the algebraic sum of $4S_2$ in which the net charges stored in devices 65 and 66 are summed with positive sign and the net charges stored in devices 67 and 68 are summed with a negative sign. Also, during the time interval $t_7$–$t_8$, the voltage on line $Y_1$ drops to $-10$ volts, allowing the charge now in the second and fourth storage regions of device 65 to transfer to the first and third storage regions of this device. The voltage on column line $Y_2$ remains as zero, thus charge continues to be stored in the second and fourth storage regions of the second device 66. The voltage on line $Y_3$ decreases to 0 volts, thus shifting the charge now in the first and third storage regions of device 67 to the second and fourth storage regions of this device. The voltage on line $Y_4$ remains at $-10$ volts and charge continues to be stored in the first and third storage regions of this device. Thus, at the instant $t_8$, charge in the first and fourth storage devices 65 and 68 are stored in the first and third storage regions thereof, and charge in the second and third devices 67 and 68 is stored in the second and fourth storage regions thereof.

After resetting the output of the amplifier 140 by the restorer pulse occurring in the time $t_8$, the apparatus is set for obtaining the third summation shown in Table 3. During the time interval $t_8$–$t_9$, voltage on column lines $Y_1$ and $Y_4$ changes from $-10$ to 0 volts to transfer the charge in these devices from the first and third storage regions to the second and fourth storage regions thereof, and simultaneously the voltage on column lines $Y_2$ and $Y_3$ changes from 0 to $-10$ volts to transfer charge from the second and fourth storage regions to the first and third storage regions in the second and third devices 66 and 67 to produce the summation equal to $4S_3$ shown in the third equation of Table 3. Also, during the interval $t_8-t_9$, charge is shifted in the first, second, third, and fourth devices so as to reside in the first and third storage regions of the first and third devices and to reside in the second and fourth storage regions of the second and fourth devices.

After restoring the output terminal 141 to ground level at time $t_9$, the change in voltage on the column lines $Y_1$ through $Y_4$ causes transfer of the charge from the first and third storage regions of the first and third devices to the second and fourth storage regions thereof, and also causes the transfer of charge from the second and fourth storage regions of the second and fourth devices 66 and 68 to the first and third storage regions thereof to provide the fourth summation signal $4S_4$ shown in Table 3.

The summation signals $4S_1$, $4S_2$, $4S_3$, and $4S_4$ are shown in FIG. 6Y. If it is assumed that the relative magnitude of the charges stored in devices 65 through 68 and hence the values of $S_1$ through $S_4$ are respectively 1, 3, 2, and 4, the algebraic sum of these signals stored in the first, second, third and fourth devices, represented by $\Sigma_A$ through $\Sigma_D$, are 10, $-2$, 0, and $-4$, respectively. Utilizing these values in the equations of Table 3 yields for $4S_1$ through $4S_4$ the values of 4, 12, 18, and 16, respectively. Thus, the analog signal samples are recovered, as desired. The signals are not only recovered but they are recovered with gain. The gain is a function of the number of samples utilized in the sequence of samples and hence of the number of devices in the array. Preferably, the number of devices of the array is equal to the number of analog signal samples utilized. Increase in the number of devices and samples improves the signal-to-noise ratio of the apparatus. Also, as each of the samples of the analog signal is stored in all of the locations on the apparatus, localized variations in storage properties as well as transfer characteristics are minimized.

While in the apparatus of FIG. 5 the summation signals were in accordance with a Hadamard matrix to provide Hadamard transforms of the charges stored in the devices of the array with each summation signal corresponding to a transform point, it will be understood that other transforms, for example, such as those constituted of cyclical binary codes may be utilized in accordance with the present invention. Preferably, the matrices constituted of such cylical binary codes are orthogonal.

While the read cycle was shown ot occur immediately after the write cycle in the apparatus, it will be understood that the read cycle could be postponed or delayed for any desired period of time after the write cycle to provide a delay in the readout. The delay, of course, would be substantially less than the time it takes for thermally generated charge to fill the storage regions of the devices.

Of course, in the operation of the apparatus of FIG. 5, the storage devices 65-68 would be masked to radiation which would generate undesired and extraneous charge in the devices.

While the invention has been described in connection with an array constituted of an N-type conductivity substrate, a P-type conductivity substrate could as well be used. Of course, in such a case the applied potentials would be reversed in polarity.

While in the apparatus of FIG. 5 the first and third storage electrodes of each storage device were connected to a respective column line and the second and fourth storage electrodes were connected to separate row lines, an organization of identical storage devices in which the first and third storage electrodes of each device were connected to separate column lines and the second and fourth storage electrodes of all of the devices were connected to a common row line could be used. In such an organization of devices, the read out of the devices would be accomplished by presetting the stored packets of charge in either first and third or the second and fourth storage regions of the devices and effecting a simultaneous transfer to induce a net charge on the common row line. Such an organization eliminates the need for a differential amplifier, such as amplifier 140. However, such an organization would require a code generator providing waveforms to the first and third storage electrodes of the devices to enable such a mode of operation to be obtained.

While the invention has been described in specific embodiments, it will be appreciated that modifications such as those described above may be made by those skilled in the art, and it is intended by the appended claims to cover all such modifications and changes as fall within the true spirit and scope of the invention.

What we claim as new and desire to secure by Letters Patent of the United States is:

1. Signal processing apparatus comprising
    a substrate of semiconductor material of one type conductivity having a major surface,
    first means forming a plurality of first charge storage regions for opposite type carriers adjacent said major surface of said substrate,
    second means forming a plurality of second charge storage regions for opposite type carriers adjacent said major surface of said substrate, each coupled to a respective first charge storage region to form a plurality of first storage cells,
    third means forming a plurality of third charge storage regions for opposite type carriers adjacent said major surface of said substrate,
    fourth means forming a plurality of fourth charge storage regions for opposite type carriers adjacent said major surface of said substrate, each coupled to a respective third charge storage region to form a plurality of second charge storage cells,
    each of said first charge storage cells being paired with a respective one of said second charge storage cells,
    a first row conductor line, a second row conductor line and a plurality of column conductor lines,
    said first means including a plurality of first electrodes, each insulatingly overlying a respective one of said first storage regions,
    said second means including a plurality of second electrodes, each insulatingly overlying a respective one of said second storage regions and each connected to said first row line,
    said third means including a plurality of third electrodes, each insulatingly overlying a respective one of said third storage regions,
    said fourth means including a plurality of fourth electrodes, each insulatingly overlying a respective one of said fourth storage regions and each connected to said second row line,
    the first and third electrodes of each of said pairs of first and second storage cells being connected to a respective column line, a plurality of charge introduction means, each associated with a respective one of said pairs of said first and second storage cells, each of said charge introduction means developing a sequence of packets of charge in response to an analog signal, each packet of charge of said sequence being proportional to a respective sample of said analog signal, corresponding packets of charge of said sequences of packets being substantially identical, each of said charge introduction means including means for transferring a packet of charge alternatively into the cells of a respective pair of cells.

2. The apparatus of claim 1 in which the number of packets of charge in each of said sequences of packets of charge is equal to the number of said pairs of first and second storage cells.

3. The apparatus of claim 1 including means for storing packets of charge in each pair of said pairs of first and second storage cells to represent a respective algebraic sum of the packets of said sequence including:

means for transferring packets of charge to be read out with one sign in each pair of cells to the first storage cells thereof, means for transferring packets of charge to be read out with the opposite sign in each pair of cells to the second storage cells thereof.

4. The apparatus of claim 3 including means for deriving a signal proportional to the algebraic sum of the packets of a sequence stored in a pair of said first and second storage cells including:

means for initially storing the packets of said sequence in the first storage region and the third storage region of said pair of storage cells and thereafter transferring the packets of said sequence to respective second and fourth storage regions of said pair of storage cells, means for sensing the difference in the signal induced on the second electrode and the signal induced on the fourth electrode of said pair of cells in response to the transfer of the packets of said sequence.

5. The apparatus of claim 3 including means for deriving a signal proportional to the algebraic sum of the packets of a sequence stored in a pair of said first and second storage cells including:

means for initially storing the packets of said sequence in the second storage region and the fourth storage region of said pair of storage cells and thereafter transferring the packets of said sequence to respective first and third storage regions of said pair of storage cells, means for sensing the difference in the signal induced on the second electrode and the signal induced on the fourth electrode of said pair of cells in response to the transfer of the packets of said sequence.

6. The apparatus of claim 3 including means for deriving a signal proportional to the algebraic sums of the algebraic sums of the packets of said sequences stored in said pairs of first and second storage cells including:

means for initially storing the packets of said sequences in the first storage regions and the third storage regions of said pairs of storage cells and thereafter transferring the packets of said sequences to respective second and fourth storage regions of said pairs of storage cells, means for sensing the difference in the signals induced on said second electrodes and the signals induced on said fourth electrodes of said pairs of cells in response to the transfer of packets of said sequences.

7. The combination of claim 3 including means for deriving a signal proportional to the algebraic sums of the algebraic sums of the packets of said sequences stored in said pairs of first and second storage cells including:

means for initially storing the packets of said sequences in the second storage regions and the fourth storage regions of said pairs of storage cells and thereafter transferring the packets of said sequences to respective first and third storage regions of said pairs of storage cells, means for sensing the difference in the signals induced on said second electrodes and the signals induced on said fourth electrodes of said pairs of cells in response to the transfer of packets of said sequences.

8. The apparatus of claim 3 in which each algebraic sum of the packets of a respective sequence is in accordance with the signs of a respective row of a cylical binary matrix.

9. The apparatus of claim 6 in which each algebraic sum of the packets of a respective sequence is in accordance with the signs of a respective row of an orthogonal cyclical binary matrix and in which each algebraic sum of the algebraic sums of the packets of said sequences is in accordance with the signs of a respective column of said orthogonal cylical binary matrix.

10. In combination, a substrate of semiconductor material of one type conductivity having a major surface, first means forming a first charge storage region for opposite type carriers adjacent said major surface of said substrate, second means forming a second charge storage region for opposite type carriers adjacent said major surface of said substrate and coupled to said first charge storage region to form a first storage cell, third means forming a third charge storage region for opposite type carriers adjacent said major surface of said substrate, fourth means forming a fourth charge storage region for opposite type carriers adjacent said major surface of said substrate and coupled to said third charge storage region to form a second charge storage cell, said first means including a first electrode insulatingly overlying said first storage region, and each connected to said first row line, said second means including a second electrode insulatingly overlying a said second storage region, said third means including a third electrode insulatingly overlying said third storage region, said fourth means including a fourth electrode insulatingly overlying a said fourth storage region and connected to said second electrode, a charge introduction means for developing a sequence of packets of charge in response to an analog signal, each packet of charge of said sequence being proportional to a respective sample of said analog signal, said charge introduction means including means for transferring a packet of charge alternatively into said first and second storage cells.

11. Signal processing apparatus comprising
a substrate of semiconductor material of one type conductivity having a major surface,
first means forming a plurality of first charge storage regions for opposite type carriers adjacent said major surface of said substrate,
second means forming a plurality of second charge storage regions for opposite type carriers adjacent said major surface of said substrate, each coupled to a respective first charge storage region to form a plurality of first storage cells,
third means forming a plurality of third charge storage regions for opposite type carriers adjacent said major surface of said substrate,
fourth means forming a plurality of fourth charge storage regions for opposite type carriers adjacent said major surface of said substrate, each coupled to a respective third charge storage region to form a plurality of second charge storage cells,
each of said first charge storage cells being paired with a respective one of said second charge storage cells,
said first means including a plurality of first electrodes, each insulatingly overlying a respective one of said first storage regions,
said second means including a plurality of second electrodes, each insulatingly overlying a respective one of said second storage regions and each connected to said conductive line,
said third means including a plurality of third electrodes, each insulatingly overlying a respective one of said third storage regions,
said fourth means including a plurality of fourth electrodes, each insulatingly overlying a respective one of said fourth storage regions and each connected to said conductive line,
a plurality of charge introduction means, each associated with a respective one of said pairs of said first and second storage cells,
each of said charge introduction means developing a sequence of packets of charge in response to an analog signal, each packet of charge of said sequence being proportional to a respective sample of said analog signal, corresponding packets of charge of said sequence of packets being substantially identical,
each of said charge introduction means including means for transferring a packet of charge alternatively into the cells of a respective pair of cells.

* * * * *